(12) United States Patent
Kimura et al.

(10) Patent No.: US 6,445,110 B1
(45) Date of Patent: Sep. 3, 2002

(54) PIEZOELECTRIC DEVICE

(75) Inventors: Masahiko Kimura, Kusatsu; Akira Ando, Omihachiman; Takuya Sawada, Moriyama; Hirozumi Ogawa, Shiga-ken, all of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/578,131

(22) Filed: May 24, 2000

(30) Foreign Application Priority Data

May 24, 1999 (JP) ............................. 11-143070
Mar. 22, 2000 (JP) ........................ 2000-080558

(51) Int. Cl.⁷ ............................................. H01L 41/04

(52) U.S. Cl. ...................................................... 310/358

(58) Field of Search ................................ 310/328, 357, 310/325, 358; 257/295

(56) References Cited

U.S. PATENT DOCUMENTS 6,198,119 B1 * 3/2001 Nabatame et al. .......... 257/295

* cited by examiner

Primary Examiner—Thomas M. Dougherty
Assistant Examiner—Karen B Addison
(74) Attorney, Agent, or Firm—Dickstein, Shapiro, Morin & Oshinsky, LLP.

(57) ABSTRACT

A piezoelectric device having an electromechanical coefficient, which can be applied to practical uses, is obtained by an energy-trapping effect using a piezoelectric ceramic having a layered perovskite structure provided with high-temperature resistance and little high-frequency loss. The piezoelectric device has a substrate formed of a piezoelectric ceramic having a layered perovskite structure. The c-axis in the substrate is preferentially oriented in the width direction thereof, and the substrate is polarized in the longitudinal direction. Two electrodes are formed on both main surfaces of the substrate so as to oppose each other in the vicinity of the central part thereof. As a material used for the substrate, a piezoelectric ceramic composition primarily composed of a ceramic composition represented by the general formula $CaBi_4Ti_4O_{15}$ is preferably used.

5 Claims, 3 Drawing Sheets

PIEZOELECTRIC DEVICE

BACKGROUND OF THE INVENTION

1. Field of the Invention

The present invention relates to piezoelectric devices, and more particularly, relates to a piezoelectric device used for, for example, an oscillator used in a filter for communication and in a clock generator.

2. Description of the Related Art

Conventionally, as piezoelectric resonators for oscillators used in filters for communication and in clock generators, piezoelectric devices formed of piezoelectric ceramics primarily composed of lead titanate zirconate ($Pb(Ti_xZr_{1-x})O_3$) or lead titanate ($PbTiO_3$) are widely used to employ the shear vibration of the piezoelectric ceramics. In general, the piezoelectric devices have substrates formed of rectangular piezoelectric ceramics and electrodes provided on both main surfaces of the substrate. The electrodes are not formed on the entire surfaces of the substrate, but are formed on parts of the surfaces so that parts of the electrodes oppose each other.

In the piezoelectric device thus described, by appropriately selecting the type of piezoelectric ceramic and the shapes of electrodes, a phenomenon can be realized in which the energy of the piezoelectric vibration of the piezoelectric ceramic is localized at the area between the electrodes which oppose each other, that is, an energy-trapping can be realized. Consequently, a single piezoelectric vibration mode can be obtained, and an effective piezoelectric device as a piezoelectric resonator for an oscillator used in a filter for communication and in a clock generator can be obtained. However, the piezoelectric ceramics have problems in that high-temperature resistance is poor and loss in high-frequency regions is large.

Piezoelectric ceramics having a layered perovskite structure, such as, $CaBi_4Ti_4O_{15}$ and $PbBi_4Ti_4O_{15}$, have features of high-temperature resistance, small high-frequency loss, and the like, compared to the piezoelectric ceramics primarily composed of lead titanate zirconate or lead titanate. Hence, the piezoelectric ceramics described above are expected to be suitable materials used for piezoelectric resonators which can be used under high temperature conditions or in a high frequency region. However, since the piezoelectric ceramics have strong anisotropic characteristics in the crystal, a high electromechanical coefficient cannot be obtained by a general manufacturing method for piezoelectric ceramics. Accordingly, methods have been proposed in which the c-axis in piezoelectric ceramics having a layered perovskite structure is preferentially oriented in one direction so as to obtain a large electromechanical coefficient. For example, T. Takenaka, et. al., reported that 1.6 times the electromechanical coefficient of piezoelectric ceramics produced by a conventional manufacturing method was obtained in vertical fundamental vibration of a cylindrical oscillator using an orientational ceramic of $PbBi_4Ti_4O_{15}$ formed by a hot forging method (J. Appl. Phys., vol. 55. No. 4.15 (1984)).

In general, in order to obtain a piezoelectric resonator for an oscillator used in a filter for communication and in a clock generator, a single piezoelectric vibration mode having a slight spurious vibration is necessary. In a piezoelectric device using vertical vibration and shear vibration, a single mode is generally obtained by trapping energy using opposing electrodes. However, it has been known that when the Poisson ratio of a piezoelectric ceramic is one-third or less, vertical fundamental vibration cannot trap energy. Poisson ratios of almost all piezoelectric ceramics having a layered perovskite structure, such as $CaBi_4Ti_4O_{15}$ and $PbBi_4Ti_4O_{15}$, are one-third or less, so that it is difficult to trap energy.

Concerning higher harmonic vertical vibration, since restriction of a Poisson ratio is not so strict compared to the fundamental wave, it is likely to trap energy; however, in general, the electromechanical coefficient is greatly decreased compared to that of the fundamental wave. Consequently, even though a single vibration mode is obtained, application as a piezoelectric resonator is limited. In contrast, for shear vibration, the electromechanical coefficient is at a level equivalent to that of vertical vibration, and is not restricted by a Poisson ratio.

However, no experiments to trap energy of shear vibration have been performed using a piezoelectric ceramic having a layered perovskite structure in which the c-axis is preferentially oriented in one direction. Even though piezoelectric ceramics having a layered perovskite structure, such as $CaBi_4Ti_4O_{15}$ and $PbBi_4Ti_4O_{15}$, have high-temperature resistance and little high-frequency loss, which were not provided in conventional piezoelectric materials, no piezoelectric resonator for an oscillator used in a filter for communication and in a clock generator, which can be practically used, has been manufactured as yet.

SUMMARY OF THE INVENTION

Accordingly, a major object of the present invention is to provide a piezoelectric device having an electromechanical coefficient of not less than 20%, which can be practically used, by an energy-trapping effect using a piezoelectric ceramic having a layered perovskite structure provided with high-temperature resistance and little high-frequency loss.

A piezoelectric device of the present invention comprises a substrate composed of a piezoelectric ceramic having a layered perovskite structure, and a plurality of electrodes provided at the substrate, in which one crystal axis in the substrate is preferentially oriented, and the substrate is polarized in an approximately orthogonal direction to the direction in which the crystal axis is preferentially oriented, and the plurality of electrodes are formed on surfaces of the substrate which are approximately parallel to the direction in which the crystal axis is preferentially oriented and are approximately parallel to the direction in which the substrate is polarized.

In the piezoelectric device described above, the substrate is preferably formed of a piezoelectric ceramic using a piezoelectric ceramic composition primarily composed of a ceramic composition represented by the formula $CaBi_4Ti_4O_{15}$.

When the electrodes are formed on the substrate composed of a piezoelectric ceramic having a layered perovskite structure, and when the direction in which one crystal axis in the substrate is preferentially oriented approximately orthogonal to the direction in which the substrate is polarized, and the electrodes are formed on surfaces of the substrate which are approximately parallel to the direction in which the crystal axis in the substrate is preferentially oriented and are approximately parallel to the direction in which the substrate is polarized, a device having superior high-temperature resistance and little high-frequency loss can be obtained. In addition, the device thus obtained has an electromechanical coefficient which can be practically used.

In the piezoelectric device described above, when the piezoelectric ceramic composition is used, which is primarily composed of a ceramic composition represented by, specifically, the formula $CaBi_4Ti_4O_{15}$, superior temperature stability of resonant frequency can be achieved.

The objects described above, other objects, features, and advantages of the present invention will be apparent from the following detailed description of preferred embodiments thereof with reference to the drawings.

DESCRIPTION OF THE PREFERRED EMBODIMENTS

Figure 1:
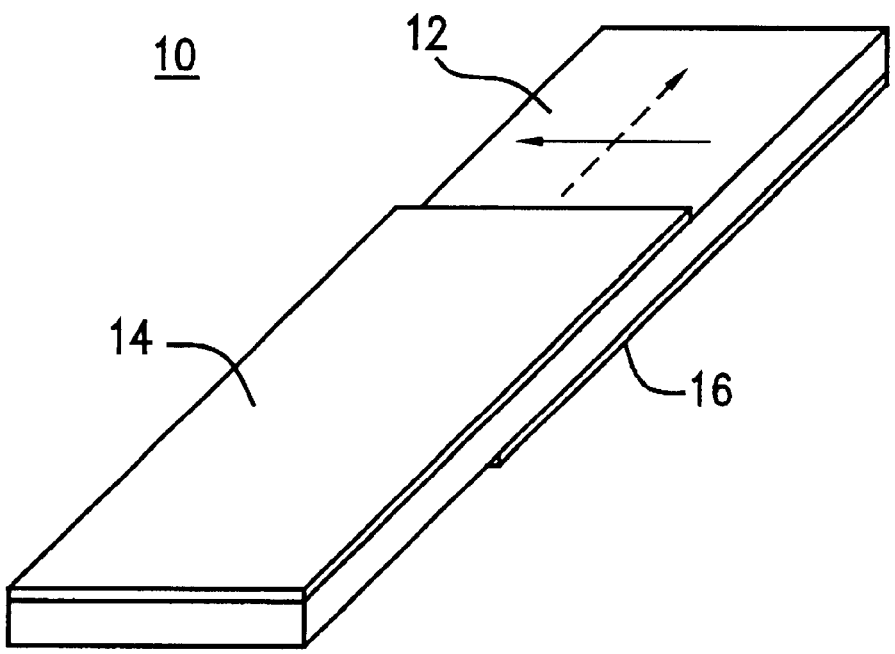
FIG. 1 is a perspective view showing an example of a piezoelectric device according to the present invention.

FIG. 1 is a perspective view showing an example of a piezoelectric device according to the present invention. A piezoelectric device 10 comprises a substrate 12, for example, in the form of a rectangular parallelepiped. As a material for the substrate 12, $CaBi_4Ti_4O_{15}$ or the like is used. The substrate 12 has a layered perovskite structure, in which the c-axis is preferentially oriented in the width direction of the substrate 12 as indicated by a solid arrow. In addition, as shown by a dotted arrow, the substrate 12 is polarized in the longitudinal direction thereof. A first electrode 14 and a second electrode 16 are respectively formed on each of the main surfaces in the thickness direction of the substrate 12. The first electrode 14 is formed from one longitudinal end to a central part of the substrate 12. The second electrode 16 is formed from the other longitudinal end to a central part of the substrate 12. The first electrode 14 and the second electrode 16 oppose each other in the vicinity of the central part of the substrate 12. Accordingly, the first electrode 14 and the second electrode 16 are formed on the main surfaces which are parallel to the direction in which the c-axis is preferentially oriented (hereinafter referred to as the preferential c-axis oriented direction), and which are parallel to the direction in which the substrate is polarized (hereinafter referred to as the polarized direction).

In the piezoelectric device 10, since the preferential c-axis oriented direction and the polarized direction cross orthogonally, and the first electrode 14 and the second electrode 16 are formed on the surfaces parallel to both directions described above, an energy-trapping of shear vibration can be realized, and a single piezoelectric vibration mode without spurious vibration can be obtained. The electromechanical coefficient of the piezoelectric device 10 of the present invention is greater and a superior rate of change in resonant frequency with temperature can be obtained, compared to the case in which the c-axis in the piezoelectric ceramic forming the substrate 12 is not preferentially oriented, or in the case in which the relationship between the preferential c-axis oriented direction and the polarized direction or the relationship between these directions mentioned above and the electrodes are different from those described above. Furthermore, since the substrate used for the piezoelectric device 10 is composed of a piezoelectric ceramic having a layered perovskite structure, such as $CaBi_4Ti_4O_{15}$, superior high-temperature resistance, small high-frequency loss, and the like can be obtained.

The preferential c-axis oriented direction and the polarized direction may cross approximately orthogonal to each other, and when they cross at angles not deviating more than 10° with respect to the orthogonal point therebetween, that is, in the range from 80° to 100°, the advantages of the present invention can be obtained. In addition, the first electrode 14 and the second electrode 16 may be formed on the surfaces approximately parallel to the preferential c-axis oriented direction and to the polarized direction, and when the electrodes incline at angles of not more than 10° from the surfaces parallel to these directions, the advantages of the present invention can be obtained.

EXAMPLE

After CaO, $Bi_2O_3$ and $TiO_2$ were prepared as starting materials and were measured so as to form the composition $CaBi_4Ti_4O_{15}$, the starting materials were wet-blended for 4 hours using a ball mill, and a mixture was obtained. After drying, the mixture was pre-baked at 900° C. and was coarsely pulverized, and after adding an appropriate amount of an organic binder to the mixture, wet-pulverization was performed for 4 hours using a ball mill. The product thus prepared was sieved with a #40 sieve to control particle size. Next, the product was molded at a pressure of 1,000 kg/cm$^2$ to form a cylinder having a diameter of 20 mm and a thickness of 10 mm, and the cylinder thus formed was heat treated at 600° C. so as to remove the organic binder and obtain a pretreated product.

Figure 2A:
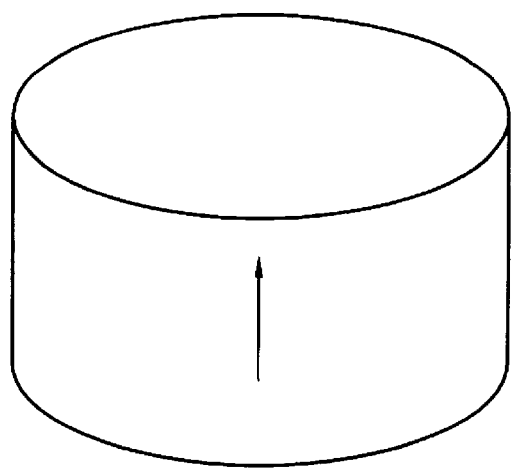
FIG. 2A is a perspective view showing a baked product in which the c-axis is preferentially oriented.
Figure 2B:
FIGS. 2B to 2D are perspective views showing substrates cut from the baked product shown in FIG. 2A.
Figure 2C:
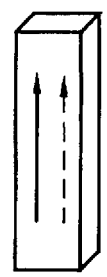
Figure 2D:
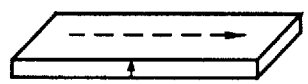

While the pretreated product was pressed in the thickness direction thereof at a total pressure of 1 ton by mono-axial pressing, the pretreated product was baked at 1,200° C. for 2 hours to obtain a baked product. When the baked product was evaluated by x-ray analysis, it was confirmed that the baked product in which the c-axis thereof preferentially oriented along the mono-axial pressing direction was obtained, as shown by an arrow in FIG. 2A. The baked product was cut into rectangular substrates, which were 10 mm long, 2.5 mm wide and 0.25 mm thick, by three different methods described below. As shown in FIG. 2B, a substrate in which two main surfaces thereof were parallel to the c-axis oriented direction (thickness direction of the baked product) and a longitudinal direction was orthogonal thereto was designated as sample 1. As shown in FIG. 2C, a substrate in which two main surfaces thereof were parallel to the c-axis oriented direction and a longitudinal direction was parallel thereto was designated as sample 2. Furthermore, as shown in FIG. 2D, a substrate in which two main surfaces thereof were orthogonal to the c-axis oriented direction. In FIGS. 2B to 2D, solid arrows indicate the c-axis oriented direction was designated as sample 3.

In addition, the pretreated product was baked at 1,200° C. for 2 hours in the air. When a resulting baked product was evaluated by x-ray analysis, no orientation could be observed. The baked product was also cut into rectangular substrates which were 10 mm long, 2.5 mm wide and 0.25 thick, similar to the samples 1 to 3 cut from the baked product having the preferential c-axis orientation. A substrate in which two main surfaces thereof were parallel to the thickness direction of the baked product and the longitudinal direction was orthogonal thereto was designated as sample 4. A substrate in which two main surfaces thereof were parallel to the thickness direction of the baked product and a longitudinal direction was parallel thereto was designated as sample 5. A substrate in which two main surfaces thereof were orthogonal to the thickness direction of the baked product was designated as sample 6.

Figure 3:
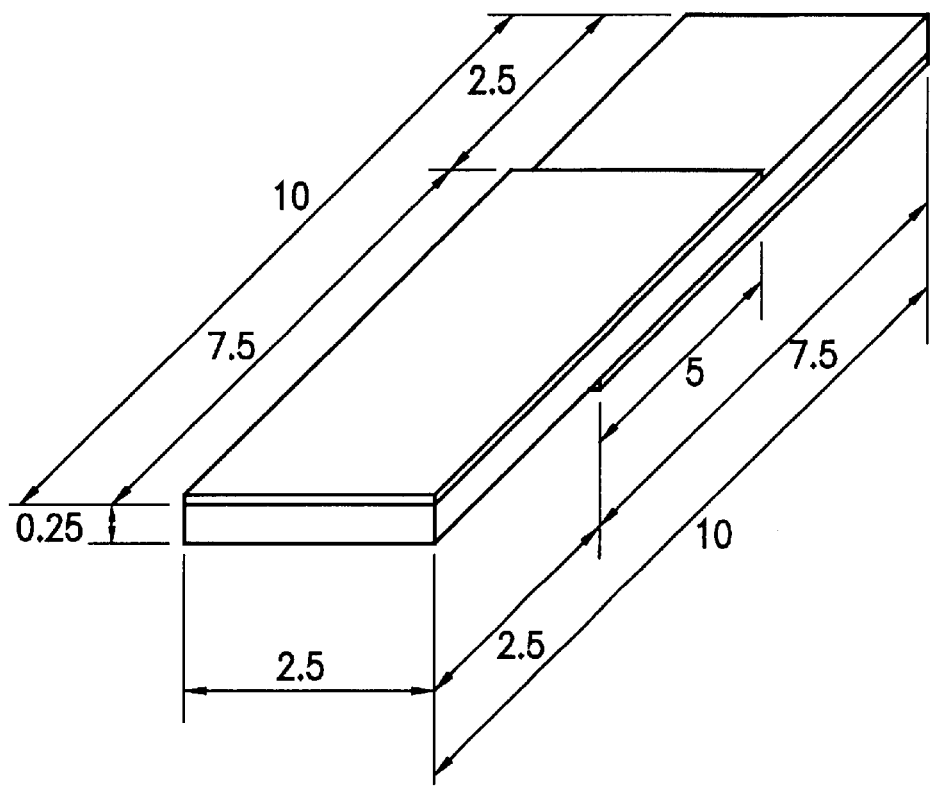
FIG. 3 is a perspective view showing a substrate formed in the example provided with electrodes.

Silver electrodes were formed on the entire opposing edge faces in the longitudinal direction of the samples 1 to 6 by coating a silver paste thereon followed by baking, and polarization was performed in which direct current of 5 kV/mm was applied to the samples for 1 hour in an insulating oil at 200° C. Accordingly, the substrates were polarized in the longitudinal directions thereof, that is, the samples 1 to 3 were polarized in the directions indicated by dotted arrows in FIGS. 2B to 2D. After removing the silver electrodes from the samples, as shown in FIG. 3, electrodes were formed on both main surfaces of the substrates. A 7.5 mm-long electrode was formed on one main surface of the substrate from one edge thereof in the longitudinal direction to a central portion thereof. In addition, a 7.5 mm-long electrode was formed on the other main surface of the sample from one edge thereof in the longitudinal direction to a central portion thereof. Accordingly, in an area 5 mm long in the longitudinal direction at a central part of the sample, two electrodes opposed each other.

Piezoelectric devices were formed by providing electrodes as shown in FIG. 3 on individual substrates of samples 1 to 6, and the piezoelectric devices thus obtained from the samples 1, 2, 3, 4, 5, and 6 are called samples a, b, c, d, e, and f, respectively. Electromechanical coefficients and rates of change in resonant frequency with temperature (fr-TC) from −20° C. to 80° C. were measured for the resulting samples a to f, and the results are shown in Table 1. The rate of change in resonant frequency with temperature is represented by the following equation, (fr-TC)={(resonant frequency at 80° C.)−(resonant frequency at −20° C.)}/{(resonant frequency at 20° C.)/ 100}.

TABLE 1

| | Electromechanical Coefficient K (%) | Rate of Change in Resonant Frequency with Temperature fr-TC(ppm) |
|---|---|---|
| Sample a | 28.0 | −30 |
| Sample b | Not measurable | Not measurable |
| Sample c | 5.1 | −139 |
| Sample d | 12.1 | −69 |
| Sample e | 12.4 | −73 |
| Sample f | 11.9 | −72 |

As can be seen from Table 1, for the samples a, and c to f, a single piezoelectric vibration mode without spurious vibration was obtained. However, for the sample b, the piezoelectric vibration was so weak that measurement could not be performed. Concerning the samples c to f, electromechanical coefficients K were approximately 5 to 10% and were not sufficient for practical use. In contrast, the sample a had an electromechanical coefficient K of 20% or more, and that result was sufficient for practical use. In addition, concerning the sample a, the absolute value of the rate of change in resonant frequency with temperature was noticeably less compared to those of the samples c to f. As piezoelectric resonators for oscillators used in filters for communication and in clock generators, a small absolute value of rate of change in resonant frequency with temperature is preferable. From this point of view, the sample a is superior to the samples c to f.

As has thus been described, in a ceramic having a layered perovskite structure, when the c-axis is preferentially oriented, polarization is performed in the direction orthogonal to the preferential c-axis oriented direction, and electrodes are formed on surfaces parallel to the preferential c-axis oriented direction and to the polarized direction, an energy-trapping of shear vibration can be realized, and a single piezoelectric vibration mode without spurious vibration can be obtained. In addition, a greater electromechanical coefficient and a superior temperature characteristic of resonant frequency can be obtained, compared to the case in which the c-axis is not preferentially oriented, and the conditions described above are not satisfied. Consequently, the piezoelectric device of the present invention has sufficient properties to be used as a piezoelectric resonator for an oscillator used in filters for communication and in clock generators. In addition, shape and size of the electrodes are not limited to those shown in FIG. 3. When optional shape and size of the electrodes capable of realizing an energy-trapping of shear vibration are employed, the advantages described above can be observed.

Furthermore, electromechanical coefficients and rates of change in resonant frequency with temperature (fr-TC) were measured for samples having angles of 90°, 80° and 70° formed by the preferential c-axis oriented direction and the polarized direction. In addition, electromechanical coefficients and rates of change in resonant frequency with temperature of the samples described above were also measured in the case in which angles formed by the preferential c-axis oriented direction and the electrodes were 0° (parallel), 10° and 20°, angles formed by the polarized direction and the electrodes were 0° (parallel), 10° and 20°, and a combination thereof. The results are shown in Table 2.

TABLE 2

| Relationship Between Preferential Orientation, Polarization, and Electrodes | | | Rate of Change in Resonant Frequency | |
|---|---|---|---|---|
| Preferential Orientation vs. Polarization | Preferential Orientation vs. Electrodes | Polarization vs. Electrodes | Electromechanical Coefficient K (%) | With Temperature fr-TC (ppm) |
| Orthogonal (90°) | Parallel (0°) | Parallel (0°) | 28.0 | 30 |
| | | 10° | 24.2 | 41 |
| | | 20° | 18.2 | 51 |
| | 10° | Parallel (0°) | 23.2 | 45 |
| | | 10° | 22.8 | 53 |
| | | 20° | 14.9 | 63 |
| | 20° | Parallel (0°) | 16.6 | 51 |
| | | 10° | 13.8 | 61 |
| | | 20° | 13.1 | 72 |
| 80° | Parallel (0°) | Parallel (0°) | 24.8 | 40 |
| | | 10° | 22.6 | 52 |
| | | 20° | 15.8 | 65 |

TABLE 2-continued

| Relationship Between Preferential Orientation, Polarization, and Electrodes | | | Rate of Change in Resonant Frequency | |
|---|---|---|---|---|
| Preferential Orientation vs. Polarization | Preferential Orientation vs. Electrodes | Polarization vs. Electrodes | Electromechanical Coefficient K (%) | With Temperature fr-TC (ppm) |
| | 10° | Parallel (0°) | 22.8 | 48 |
| | | 10° | 20.2 | 59 |
| | | 20° | 13.4 | 72 |
| | 20° | Parallel (0°) | 15.8 | 60 |
| | | 10° | 12.7 | 72 |
| | | 20° | 10.3 | 78 |
| 70° | Parallel (0°) | Parallel (0°) | 19.4 | 53 |
| | | 10° | 14.8 | 66 |
| | | 20° | 13.1 | 71 |
| | 10° | Parallel (0°) | 15.2 | 61 |
| | | 10° | 13.1 | 72 |
| | | 20° | 12.8 | 75 |
| | 20° | Parallel (0°) | 13.4 | 67 |
| | | 10° | 12.8 | 72 |
| | | 20° | 12.2 | 79 |

As can be seen from Table 2, when a sample had angles of 90° and 80° formed by the preferential c-axis oriented direction and the polarized direction, angles of 0° and 10° formed by the preferential c-axis oriented direction and the electrodes, and angles of 0° and 10° formed by the polarized direction and the electrodes, the electromechanical coefficient was 20% or more and the rate of change in resonant frequency with temperature was also small. In contrast, electromechanical coefficients of other samples were less than 20%. As described above, when the angles formed by the preferential c-axis oriented direction and the polarized direction was not more than 10° with respect to the orthogonal point therebetween, and when the electrodes incline at angles of not more than 10° from the preferential c-axis oriented direction and at angles not more than 10° from the polarized direction, a great electromechanical coefficient and a small rate of change in resonant frequency with temperature were obtained.

As a material for the substrate, piezoelectric ceramics primarily composed of compounds having layered perovskite structures provided with distinguishing anisotropy in the c-axis direction are effectively used. They are, in addition to $CaBi_4Ti_4O_{15}$, for example, $Bi_3TiNbO_9$, $Bi_4Ti_3O_{12}$, $PbBi_3Ti_2NbO_{12}$, $BaBi_3Ti_2NbO_{12}$, $SrBi_3Ti_2NbO_{12}$, $CaBi_3Ti_2NbO_{12}PbBi_4Ti_4O_{15}$, $SrBi_4Ti_4O_{15}$, $BaBi_4Ti_4O_{15}$, $Na_{0.5}Bi_{4.5}Ti_5O_{15}$, $K_{0.5}Bi_{4.5}Ti_5O_{15}$, $Sr_2Bi_4Ti_5O_{18}$, $Ba_2Bi_4Ti_5O_{18}$, $Pb_2Bi_4Ti_5O_{18}$, $Ca_2Bi_4Ti_5O_{18}$, $Bi_6Ti_3WO_{18}$, $Bi_7Ti_4NbO_{21}$, and $Bi_{10}Ti_3W_3O_{30}$.

However, since $CaBi_4Ti_4O_{15}$ has a specifically high Curie temperature (approximately 790° C.) and superior temperature stability among the compounds having layered perovskite structures, it is particularly effective to produce a piezoelectric device using $CaBi_4Ti_4O_{15}$.

According to the present invention, using an energy-trapping effect of shear vibration, a piezoelectric device as an effective piezoelectric resonator for an oscillator used in a filter for communication and in a clock generator can be obtained. In addition, the piezoelectric device has an electromechanical coefficient which can be applied in practical uses and has features such as high-temperature resistance and small high-frequency loss, which are provided to piezoelectric ceramics having layered perovskite structure.

Furthermore, by using $CaBi_4Ti_4O_{15}$ as a material for piezoelectric ceramics, the piezoelectric device having a small rate of change in resonant frequency with temperature can be obtained.

What is claimed is:

1. A piezoelectric device comprising:
    a substrate comprising a piezoelectric ceramic of a ceramic composition represented by the formula $CaBi_4Ti_4O_{15}$ and having a layered perovskite structure; and a plurality of electrodes on the substrate;
    wherein one crystal axis in the substrate is preferentially oriented, and the substrate is polarized in an approximately orthogonal direction to the direction in which the crystal axis is preferentially oriented, and
    the plurality of electrodes are formed on surfaces of the substrate which are approximately parallel to the direction in which the crystal axis is preferentially oriented and are approximately parallel to the direction in which the substrate is polarized.

2. A piezoelectric device according to claim 1, wherein the electrodes do not incline at an angle of more than 10° from the surfaces approximately parallel to the direction in which the crystal axis is preferentially oriented and are approximately parallel to the direction in which the substrate is polarized.

3. A piezoelectric device according to claim 1, wherein the axis preferentially oriented is the c-axis and the preferential c-axis oriented direction and the polarized direction cross at an angle not deviating more than 10° with respect to the orthogonal point therebetween.

4. A piezoelectric device according to claim 3, wherein the substrate is approximately rectangular and wherein the c-axis in the substrate is preferentially oriented in the width direction thereof and the substrate is polarized in the longitudinal direction.

5. A piezoelectric device according to claim 1, wherein the substrate is approximately rectangular and wherein the c-axis in the substrate is preferentially oriented in the width direction thereof and the substrate is polarized in the longitudinal direction.

* * * * *